United States Patent
Takano

(10) Patent No.: US 6,477,092 B2
(45) Date of Patent: Nov. 5, 2002

(54) LEVEL SHIFTER OF NONVOLATILE SEMICONDUCTOR MEMORY

(75) Inventor: Yoshinori Takano, Ichikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/842,693

(22) Filed: Apr. 27, 2001

(65) Prior Publication Data

US 2001/0036108 A1 Nov. 1, 2001

(30) Foreign Application Priority Data

Apr. 28, 2000 (JP) ........................................ 2000-131388

(51) Int. Cl.[7] ................................................ G11C 7/00
(52) U.S. Cl. .................................. 365/189.11; 365/226
(58) Field of Search ............................ 365/189.11, 191, 365/218, 189.08, 230.06, 226, 227

(56) References Cited

U.S. PATENT DOCUMENTS

| | | | | | |
|---|---|---|---|---|---|
| 5,309,402 A | * | 5/1994 | Okazawa | ............... | 365/185.13 |
| 5,930,188 A | * | 7/1999 | Roohparvar | ............ | 365/185.18 |
| 5,959,902 A | * | 9/1999 | Fontana et al. | ......... | 365/189.11 |
| 5,973,963 A | * | 10/1999 | Sugawara | ............... | 365/185.23 |
| 6,044,020 A | * | 3/2000 | Chung et al. | ........... | 365/185.11 |

* cited by examiner

Primary Examiner—David Nelms
Assistant Examiner—Thong Le
(74) Attorney, Agent, or Firm—Banner & Witcoff, Ltd.

(57) ABSTRACT

A first level shifter outputs one of a first potential and a second potential lower than the first potential from an output terminal in accordance with the level of an input signal. A second level shifter outputs one of the first potential and a third potential lower than the second potential from an output terminal in accordance with the output potential from the first level shifter. A third level shifter outputs one of the first and second potentials from an output terminal in accordance with the level of the input signal. A first switching circuit selects the output voltage from the second level shifter when a high-speed operation is required such as in a read operation.

22 Claims, 10 Drawing Sheets

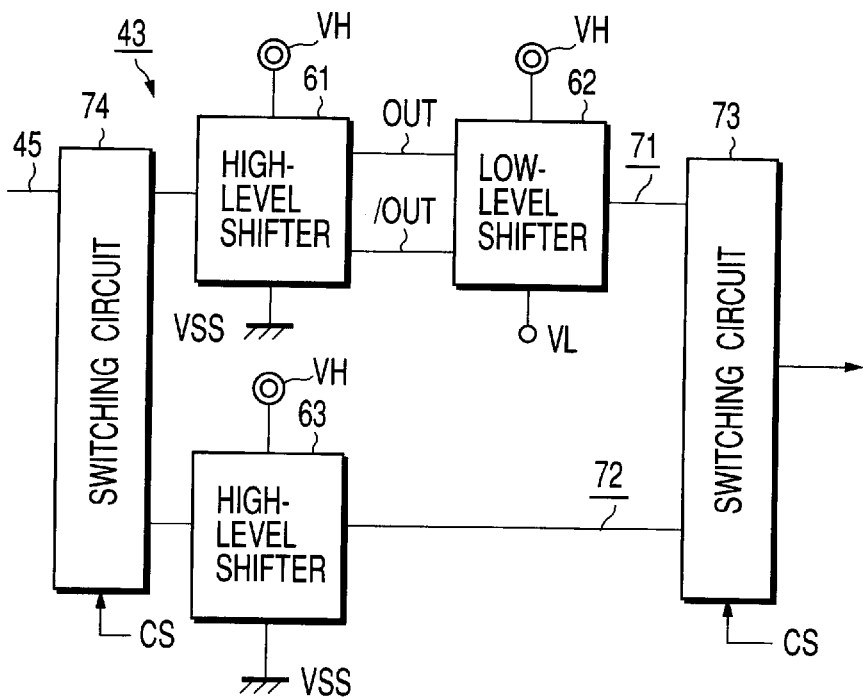
FIG. 5
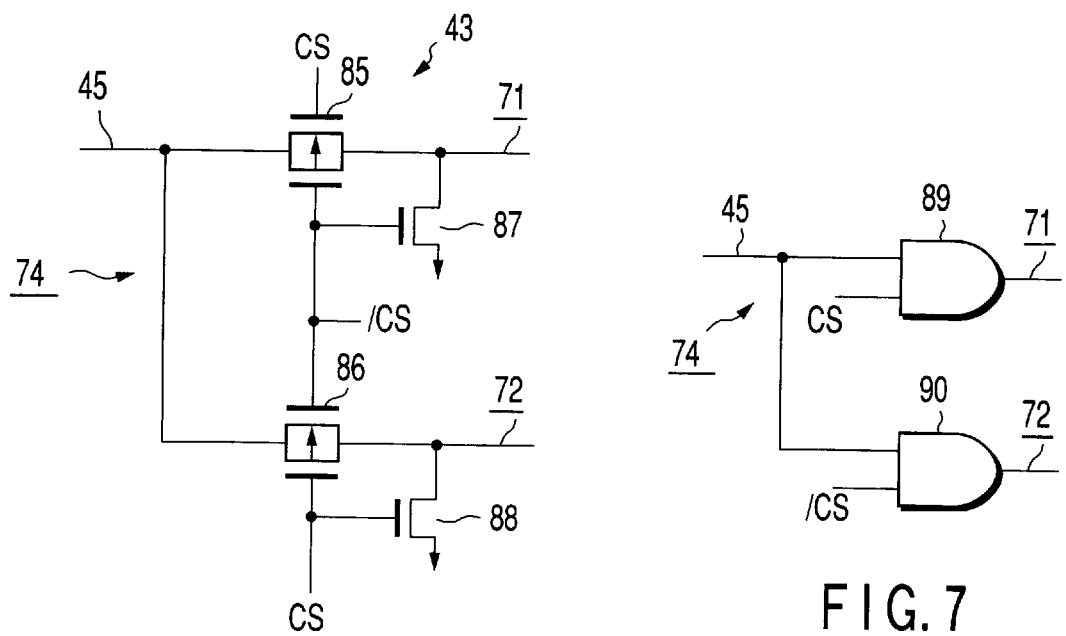
FIG. 6
FIG. 7

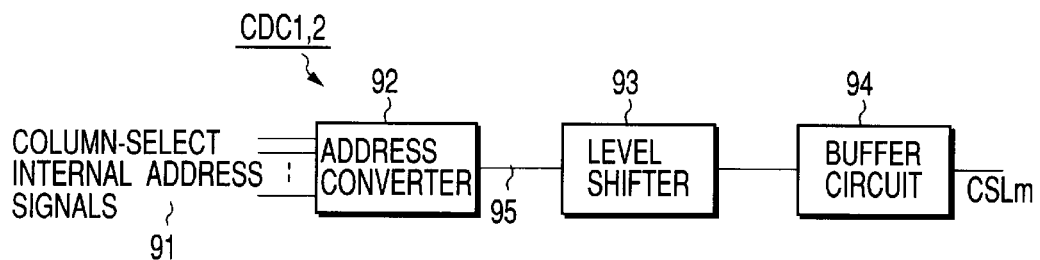
F I G. 10
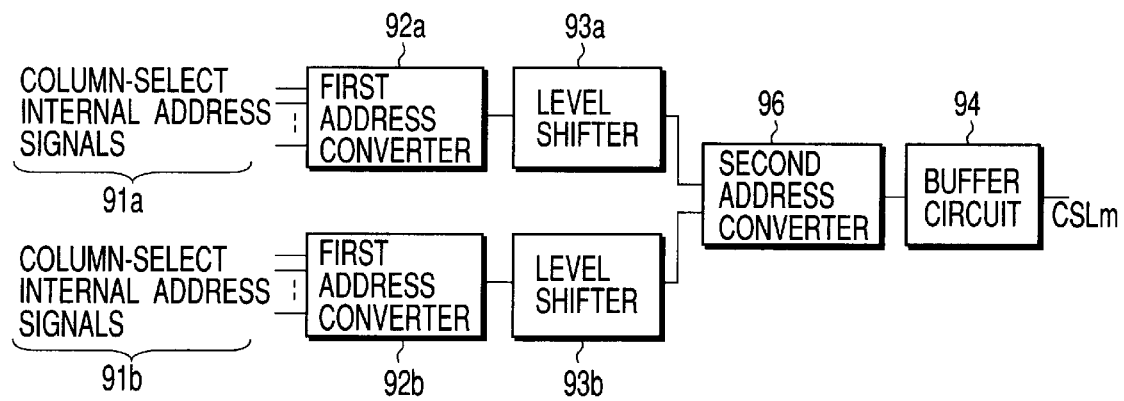
F I G. 11
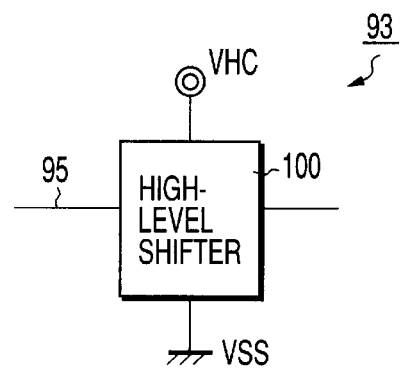
F I G. 12

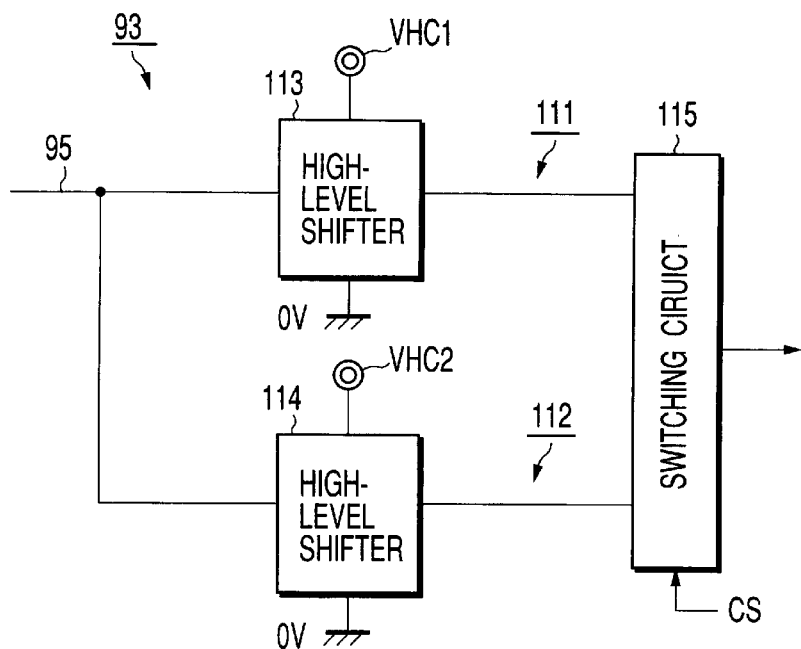
FIG. 13
| | VHC1 | VHC2 |
|---|---|---|
| READ | 5V | 5V |
| WRITE | 10V | 5V |
FIG. 14
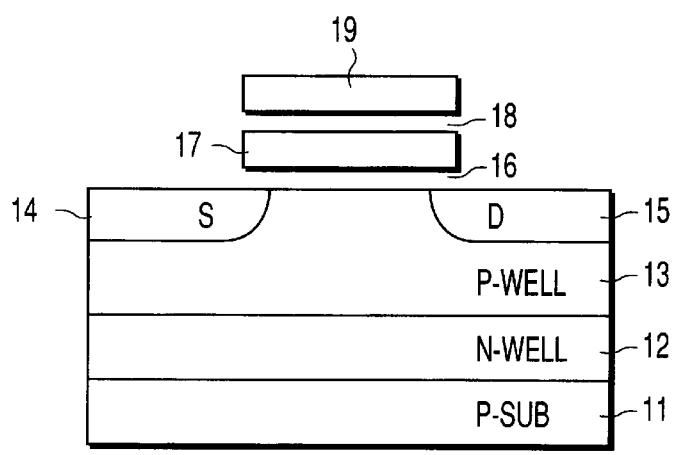
FIG. 15

| IN | OUT | /OUT |
|---|---|---|
| 0V | 0V | VH |
| Vcc | VH | 0V |

F I G. 23A

| IN(OUT) | /IN(OUT) | OUT1 |
|---|---|---|
| 0V | VH | VL |
| VH | 0V | VH |

F I G. 23B

| IN | OUT | OUT1 |
|---|---|---|
| Vcc | VH | VH |
| 0V | 0V | VL |

F I G. 24A

|  | VH | VL |
|---|---|---|
| READ | 5V | 0V |
| WRITE | 10V | 0V |
| ERASE | CONSTANT | -7V |

F I G. 24B

LEVEL SHIFTER OF NONVOLATILE SEMICONDUCTOR MEMORY

CROSS-REFERENCE TO RELATED APPLICATIONS

This application is based upon and claims the benefit of priority from the prior Japanese Patent Application No. 2000-131388, filed Apr. 28, 2000, the entire contents of which are incorporated herein by reference.

BACKGROUND OF THE INVENTION

The present invention relates to a level shifter applied to a decoding circuit of a semiconductor memory, e.g., a nonvolatile semiconductor memory such as an EEPROM (Electrically Erasable Programmable Read Only Memory).

A nonvolatile semiconductor memory in which data in a plurality of memory cells are simultaneously erased is called a flash memory.

FIG. 15 shows an example of the structure of a memory cell called a stacked gate memory cell applied to a nonvolatile semiconductor memory. Referring to FIG. 15, a P-well 13 is formed in an N-well 12 on a P-substrate 11. On the surface of this P-well 13, a polysilicon floating gate 17 is formed via a gate insulating film 16. A control gate 19 is formed on the floating gate 17 via an insulating film 18. A source (S) 14 and a drain (D) 15 each made of an N-impurity are formed in surface regions of the P-well 13 on the both sides of the floating gate 17 and the control gate 19.

The operation of the above memory cell will be briefly described below.

To write data in this memory cell, electrons are injected into the floating gate 17. During this injection, 6V, for example, are applied to the drain 15, 0V (ground potential) is applied to the P-well 13 (including the P-substrate 11 and the N-well 12) and the source 14, and about 10V are applied to the control gate 19. The floating gate 17 is not connected to an external power supply. Hence, the potential of this floating gate 17 is uniquely determined by the potentials of the control gate 19, the source 14, the drain 15, and the P-well 13, in accordance with the coupling ratio of the floating gate 17 to the P-well 13 and that of the floating gate 17 to the control gate 19. When the individual portions of the memory cell are thus set at these potentials, a strong lateral electric field (in the source-drain direction) is generated. In accordance with this electric field, hot electrons having high energy are generated. Some of these hot electrons are injected into the floating gate 17 over the barrier of the gate insulating film 16, writing data in the memory cell.

To erase data stored in the memory cell, electrons are withdrawn from the floating gate 17. This is done by, e.g., the following method. 10V, for example, are applied to the N-well 12, the P-well 13, and the source 14, and −7V are applied to the control gate 19. As a consequence, a large electric field of 10 MV/cm or more is applied to the gate insulating film 16. This large electric field causes an F-N (Fowler-Noldheim) current (tunnel current) to flow through the gate insulating film 16. Accordingly, electrons are emitted from the floating gate 17 to the P-well 13 and the source 14, erasing data in the memory cell.

Data stored in the memory cell is read out as follows. As described above, the potential of the floating gate of the written memory cell differs from that of the floating gate of the erased memory cell. That is, electrons are built up in the floating gate 17 of the written memory cell. Therefore, to form an N-channel immediately below the floating gate 17 by applying a voltage to the control gate 19, the floating gate 17 must be given a positive electric charge larger than when the channel is to be formed in the erased memory cell. More specifically, the potential (to be referred to as VREAD hereinafter) of the control gate 19 is so controlled as not to form a channel in the written memory cell but to form a channel in the erased memory cell. Accordingly, by giving an appropriate potential between the drain and source and setting the potential of the control gate 19 at VREAD, e.g., 5V, a channel is formed in the erased memory cell whereas no channel is formed in the written memory cell. Consequently, an electric current determined by the potential difference between the drain and source and the potential of the floating gate flows through the erased memory cell, similar to a common N-channel transistor. Data in the memory cell can be read out by detecting whether an electric current flows through the memory cell when VREAD is thus applied to the control gate of the memory cell.

FIG. 16 shows the configuration of a nonvolatile semiconductor memory. An input circuit 21 receives an address control signal. A control circuit 22 decodes the signal from the input circuit 21 and supplies a control signal to other circuits. A memory cell array 23 has memory cells (not shown) arrayed into m rows×n columns. A boosting circuit 24 generates a high voltage for a data write, erase, and read to the memory cells arranged in the memory cell array 23. A row decoder 25 selects a word line (not shown) arranged in the memory cell array 23, in accordance with the output signal from the control circuit 22. A column decoder 26 selects a bit line arranged in the memory cell array 23, in accordance with the output signal from the control circuit 22. A source and well decoder 27 supplies the potential of the P-well and the potential of the source to the memory cell array 23, in accordance with the output signal from the control circuit 22. A write circuit 28 performs data write and verification. A read circuit 29 discriminates data read out from a selected memory cell during data read. An output circuit 30 is connected to the read circuit 29 and outputs data read out by the read circuit 29.

FIG. 17 shows details of the arrangement of the memory cell array 23 shown in FIG. 16. For the sake of descriptive simplicity, memory cells MC are arranged into a matrix of 3 rows×4 columns in a P-well (not shown). The control gates of memory cells MC belonging to the same rows are connected to corresponding word lines WL0 to WL2. The drains of memory cells belonging to the same columns are connected to corresponding bit lines BL0 to BL3. Also, the source of each memory cell MC is connected to a source line SL, and source lines SL in the same P-well are connected together.

In data write and read, a specific memory cell is selected by a word line WLm (m=0 to 2) selected by the row decoder 25 and a bit line BLn (n=0 to 3) selected by the column decoder 26. Data write or read is performed for this selected memory cell. Data erase is performed for the m×n memory cells arranged in the same P-well at the same time.

FIG. 18 shows an example of the row decoder 25. An address converter 42 receives a plurality of row-select internal address signals 41 generated via the input circuit 21 and the control circuit 22, and activates an address-select line 45 in accordance with these internal address signals 41. The potential of the word line WLm is different from the power supply voltage (Vcc) in any of data read, write, and erase. Hence, the address-select line 45 is connected to a level shifter 43, and the potential of this address-select line 45 is converted into a required potential by the level shifter 43. The output voltage from this level shifter 43 is supplied to a buffer circuit 44. A voltage whose waveform is shaped by this buffer circuit 44 is supplied to the word line WLm.

FIG. 19 shows another example of the row decoder 25. In this example, internal address signals are divided into two systems. That is, a plurality of row-select internal address signals 41a and a plurality of row-select internal address signals 41b, generated via the input circuit 21 and the control circuit 22, are supplied to first address converters 42a and 42b, respectively. In accordance with these internal address signals 41a and 41b, the first address converters 42a and 42b activate address-select lines 45a and 45b, respectively. These address-select lines 45a and 45b are connected to level shifters 43a and 43b, respectively. These level shifters 43a and 43b convert the potentials of the address-select lines 45a and 45b into required potentials. The output voltages from the level shifter 43a and 43b are supplied to a second address converter 51. This second address converter 51 selects one of the output voltages from the first and second level shifters 43a and 43b. The output voltage from this second address converter 51 is supplied to the word line WLm via the buffer circuit 44.

FIG. 20A shows an example of the address converter 42 (including the first and second address converters 42a and 42b). This address converter 42 is an AND circuit 42c. This AND circuit 42c selects a predetermined address-select line 45 in accordance with an internal address signal.

FIG. 20B shows an example of the second address converter 51. This second address converter 51 is, e.g., an AND circuit 51a which receives a level-converted signal. For this purpose, a boosted high potential VH and a low potential VL, rather than the power supply voltage Vcc, are supplied to the AND circuit 51a.

FIG. 20C shows an example of the buffer circuit 44. This buffer circuit 44 is composed of, e.g., two series-connected inverter circuits 44a and 44b. This buffer circuit 44 receives a level-converted signal. Therefore, the power supply voltages of the inverter circuits 44a and 44b are the high potential VH and the low potential VL.

FIG. 21 shows an example of the level shifter 43 (including 43a and 43b). This level shifter 43 comprises series-connected, high- and low-level shifters 61 and 62. The high-level shifter 61 generates a potential higher than the power supply voltage Vcc. The low-level shifter 62 generates a potential lower than a ground potential VSS. An address conversion signal is supplied as an input signal IN to the high-level shifter 61. Complementary voltages OUT and /OUT output from the high-level shifter 61 are supplied to the low-level shifter 62. The output voltage from this low-level shifter 62 is an output voltage OUT1 of the level shifter. The power supply voltages of the high-level shifter 61 are the high potential VH and the ground potential VSS. The power supply voltages of the low-level shifter 62 are the high potential VH and the low potential VL. The high-level shifter 61 outputs a signal of high potential VH and a signal of ground potential of 0V, in accordance with the Vcc-level address conversion signal. The low-level shifter 62 outputs the high potential VH or the low potential VL lower than the ground potential, in accordance with the output signal from the high-level shifter 61.

The high potential VH is set at, e.g., 5V (VREAD) in data read, at, e.g., 10V in data write, and at a predetermined potential in data erase. The level of the low potential VL is set at 0V (non-selection level) in data read, at 0V (non-selection level) in data write, and at, e.g., −7V in data erase. These high and low potentials VH and VL are generated by the boosting circuit 24.

FIG. 22A is a circuit diagram showing an example of the high-level shifter 61. This high-level shifter 61 comprises N-channel transistors N1 and N2, P-channel transistors P1 and P2, and an inverter circuit INV. The input signal IN and an input signal /IN (not shown) inverted by the inverter INV are supplied to the gates of the N-channel transistors N1 and N2, respectively. The sources of these N-channel transistors N1 and N2 are grounded. The drains of the N-channel transistors N1 and N2 are connected to the drains and gates of the P-channel transistors P1 and P2, respectively. Also, the high potential VH is supplied to the sources of the P-channel transistors P1 and P2. The complementary output voltages OUT and /OUT are output from the nodes connecting the drains of the N-channel transistors N1 and N2 and the P-channel transistors P1 and P2, respectively.

FIG. 22B is a circuit diagram showing an example of the low-level shifter 62. This low-level shifter 62 includes N-channel transistors N3 and N4 and P-channel transistors P3 and P4. Complementary input signals, i.e., the output voltages OUT and /OUT from the high-level shifter 61 are supplied to the gates of the P-channel transistors P3 and P4, respectively. The high potential VH is supplied to the sources of these P-channel transistors P3 and P4. The drains of the P-channel transistors P3 and P4 are connected to the drains and gates of the N-channel transistors N3 and N4, respectively. The low potential VL is supplied to the sources of the N-channel transistors N3 and N4. The output signal OUT1 is output from the node connecting the drain of the N-channel transistor N4 and the drain of the P-channel transistor P4.

FIG. 23A shows the logic of the high-level shifter 61. FIG. 23B shows the logic of the low-level shifter 62.

When the input signal IN is the Vcc-level signal in the level shifter 43 shown in FIGS. 21, 22A, and 22B, the output voltage OUT from the high-level shifter 61 becomes the high potential VH, and the output signal OUT1 from the low-level shifter 62, as the output from the level shifter 43, also becomes the high potential VH.

On the other hand, when the input signal IN is 0V, the output voltage OUT from the high-level shifter 61 becomes 0V, and the output voltage OUT1 from the low-level shifter 62, as the output from the level shifter 43, becomes the low potential VL.

FIG. 24A shows the relationships between the input signal IN and the output voltages OUT and OUT1.

FIG. 24B shows the relationships between the high potential VH and the low potential VL in different operation modes, i.e., data write, read, and erase.

The level shifter shown in FIG. 21 has the following problem. That is, when a potential is supplied to a word line in accordance with an internal address signal, a predetermined potential is generated via both the high- and low-level shifters 61 and 62 in both write and read modes. This considerably lowers the speed of level conversion especially in data read required to be a high-speed operation.

BRIEF SUMMARY OF THE INVENTION

It is an object of the present invention to provide a semiconductor device capable of increasing the speed of level conversion and increasing the access rate.

This object of the present invention is achieved by the following arrangement.

A semiconductor device comprising: a first level shifter having an input terminal for receiving an input signal and an output terminal, the first level shifter outputting one of a first potential and a second potential lower than the first potential from the output terminal in accordance with the level of the input signal; a second level shifter having an input terminal connected to the output terminal of the first level shifter, the second level shifter outputting one of the first potential and a third potential lower than the second potential from an output terminal in accordance with the output potential from the first level shifter; a third level shifter having an input terminal for receiving the input signal and an output terminal, the third level shifter outputting one of the first and second potentials from the output terminal in accordance with the level of the input signal; and a first switching circuit connected to the output terminals of the second and third level shifters, the first switching circuit selecting one of the output potentials from the second and third level shifters in accordance with a control signal.

Also, the present invention is achieved by the following arrangement.

A semiconductor device comprising: a first level shifter having an input terminal for receiving an input signal and an output terminal, the first level shifter outputting one of a first potential and a second potential lower than the first potential from the output terminal in accordance with the level of the input signal; a second level shifter having an input terminal connected to the output terminal of the first level shifter, the second level shifter outputting one of the first potential and a third potential lower than the second potential from an output terminal in accordance with the output potential from the first level shifter; a third level shifter having an input terminal for receiving the input signal and an output terminal, the third level shifter outputting one of the second potential and a fourth potential lower than the first potential and higher than the second potential from the output terminal in accordance with the level of the input signal; and a first switching circuit connected to the output terminals of the second and third level shifters, the first switching circuit selecting one of the output potentials from the second and third level shifters in accordance with a control signal.

Furthermore, the present invention is achieved by the following arrangement.

A semiconductor device comprising: a first level shifter having an input terminal for receiving an input signal and an output terminal, the first level shifter outputting one of a first potential and a second potential lower than the first potential from the output terminal in accordance with the level of the input signal; a second level shifter having an input terminal for receiving the input signal and an output terminal, the second level shifter outputting one of the second potential and a third potential lower than the first potential and higher than the second potential in accordance with the level of the input signal; and a first switching circuit connected to the output terminals of the first and second level shifters, the first switching circuit selecting one of the output potentials from the first and second level shifters in accordance with a control signal.

According to the semiconductor device of the present invention, the speed of level conversion can be increased and the access rate can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a block diagram showing the second embodiment of the present invention;

FIG. 6 is a circuit diagram showing an example of a switching circuit shown in FIG. 5;

FIG. 7 is a circuit diagram showing another example of the switching circuit shown in FIG. 5;

FIG. 10 is a block diagram showing an example of a column decoder shown in FIG. 9;

FIG. 11 is a block diagram showing another example of the column decoder shown in FIG. 9;

FIG. 12 is a block diagram showing a column-select level shifter;

FIG. 13 is a block diagram showing the fourth embodiment of the present invention;

FIG. 14 is a view showing the relationship between high potentials VHC1 and VHC2 applied to the fourth embodiment;

FIG. 15 is a view showing the structure of a stacked gate memory cell applied to a nonvolatile semiconductor memory;

FIG. 23A shows the logic of the high-level shifter, and FIG. 23B shows the logic of the low-level shifter; and FIG. 24A shows the relationships between an input signal and output voltages, and FIGS. 24B shows the relationships between a high potential VH and a low potential VL in different operation modes.

DETAILED DESCRIPTION OF THE INVENTION

Embodiments of the present invention will be described below with reference to the accompanying drawings.

First Embodiment

Figure 1:
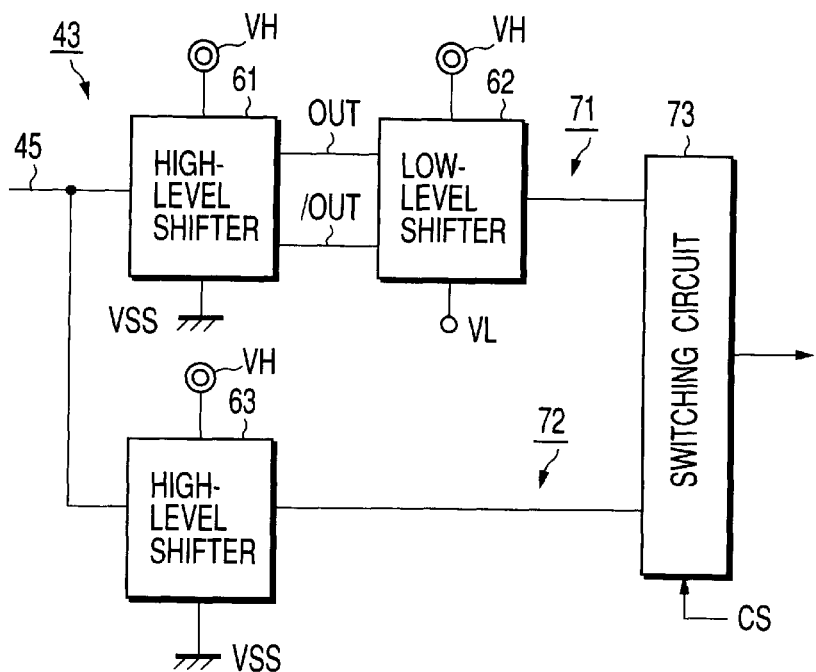
FIG. 1 is block diagram showing the first embodiment of the present invention.

FIG. 1 shows a level shifter according to the first embodiment of the present invention. In FIG. 1, the same reference numerals as in FIG. 21 denote the same parts.

Figure 21:
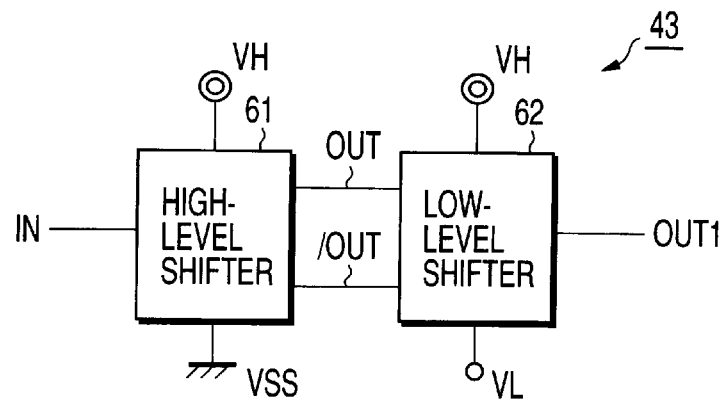
FIG. 21 is a block diagram showing an example of a level shifter.

Referring to FIG. 1, a level shifter 43 has first and second paths 71 and 72, unlike FIG. 21, and a switching circuit 73 selectively outputs the output voltages from these first and second paths 71 and 72. Similar to FIG. 21, the first path 71 has series-connected, high- and low-level shifters 61 and 62. The second path 72 has only a high-level shifter 63. The high-level shifters 61 and 63 are analogous to the circuit shown in FIG. 22A. The low-level shifter 62 is similar to the circuit shown in FIG. 22B. The output terminals of the low-level shifter 62 and the high-level shifter 63 are connected to the switching circuit 73. A control signal CS is supplied to this switching circuit 73. In accordance with this control signal CS, the switching circuit 73 selects the output voltage from the low-level shifter 62 or the high-level shifter 63.

The operation of the above arrangement will be described below. As shown in FIG. 24B, a low potential VL is 0V in data read (read mode) and data write (write mode). Also, one output voltage from each of the high-level shifters 61 and 63 is the ground voltage (0V). Therefore, either the first or second path 71 and 72 can be used in data read. When the first path 71 is used, however, both the high- and low-level shifters 61 and 62 operate to convert the level. This prolongs the time required to determine the output voltage level. On the other hand, the second path 72 includes only the high-level shifter 63. Hence, the level conversion rate is higher than that of the first path 71. In data read, therefore, the switching circuit 73 selects the output voltage from the high-level shifter 63 of the second path 72 in accordance with the control signal CS. With this control, a necessary voltage can be output at high speed.

On the other hand, a negative potential is necessary in data erase other than data read or write. Hence, the switching circuit 73 selects the output voltage from the low-level shifter 62 of the first path 71 in accordance with the control signal CS. Generally, data erase is not required to be so fast as data read in selecting a memory cell. Accordingly, the low speed is not a serious problem.

Furthermore, data write is not generally required to be so fast as data read. Therefore, the switching circuit 73 can select the output voltage from either the low- or high-level shifter 62 or 63. However, the output voltage from the high-level shifter 63 is preferably selected for the sake of high operating speed.

Referring to FIG. 1, the high-level shifters 61 and 63 have the same circuit configuration. However, these high-level shifters 61 and 63 can also have different circuit configurations.

Figure 2:
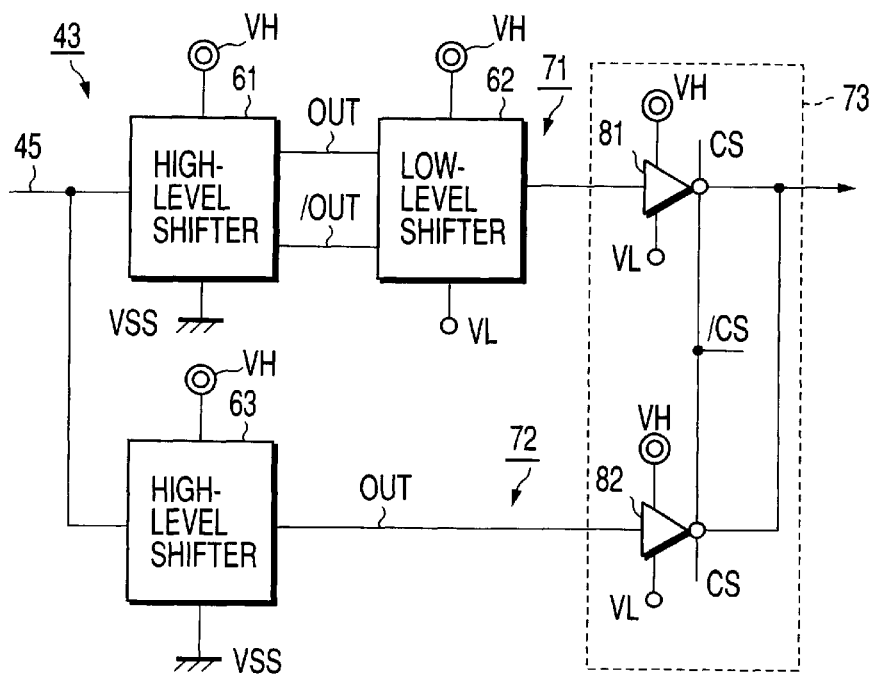
FIG. 2 is a circuit diagram showing an example of a switching circuit shown in FIG. 1.

FIG. 2 shows a practical example of the switching circuit 73 shown in FIG. 1. The same reference numerals as in FIG. 1 denote the same parts in FIG. 2, and the difference will be described below. In this example, the switching circuit 73 includes clocked inverter circuits 81 and 82. These clocked inverter circuits 81 and 82 are supplied with the high and low potentials VH and VL as power supplies and supplied with the control signal CS and its inverted signal /CS as clock signals. One of the clocked inverter circuits 81 and 82 is selected by these control signals CS and /CS. That is, when the control signal CS is at high level, the clocked inverter circuit 82 is activated, and the output voltage from the high-level shifter 63 is selected. When the control signal CS is at low level, the clocked inverter circuit 81 is activated, and the output voltage from the low-level shifter 62 is selected.

Note that the control signal /CS can be generated by an inverter circuit formed in the switching circuit 73 or can be generated outside the switching circuit 73.

Figures 3A, 3B:
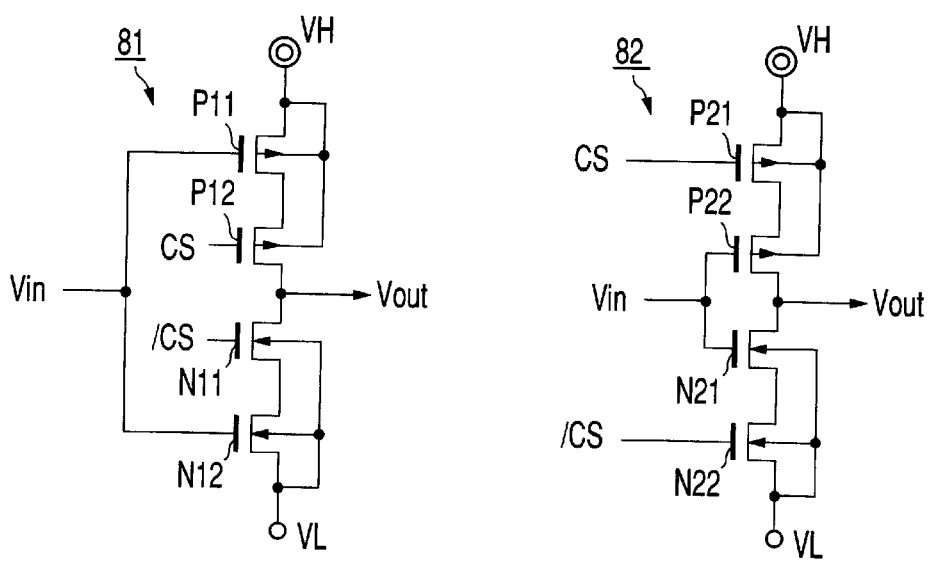
FIGS. 3A and 3B are circuit diagrams showing examples of a clocked inverter circuit.

FIGS. 3A and 3B illustrate circuit examples of the clocked inverter circuits 81 and 82. These clocked inverter circuits 81 and 82 have substantially the same configuration except for input terminals of the control signals CS and /CS.

Referring to FIG. 3A, P-channel transistors P11 and P12 and N-channel transistors N11 and N12 are connected in series between a terminal to which the high potential VH is supplied and a terminal to which the low potential VL is supplied. An input voltage Vin is supplied to the gates of the P-channel transistor P11 and the N-channel transistor N12. The control signals CS and /CS are supplied to the gates of the P-channel transistor P12 and the N-channel transistor N11, respectively. The high potential VH is supplied to the substrate of the P-channel transistors P11 and P12. The low potential VL is supplied to the substrate of the N-channel transistors N11 and N12. An output voltage Vout is output from the node connecting the P-channel transistor P12 and the N-channel transistor N11.

Referring to FIG. 3B, P-channel transistors P21 and P22 and N-channel transistors N21 and N22 are connected in series between a terminal to which the high potential VH is supplied and a terminal to which the low potential VL is supplied. The control signals CS and /CS are supplied to the gates of the P-channel transistor P21 and the N-channel transistor N22, respectively. An input voltage Vin is supplied to the gates of the P-channel transistor P22 and the N-channel transistor N21. The high potential VH is supplied to the substrate of the P-channel transistors P21 and P22. The low potential VL is supplied to the substrate of the N-channel transistors N21 and N22. An output voltage Vout is output from the node connecting the P-channel transistor P22 and the N-channel transistor N21.

In the above arrangements, when the control signal CS is at low level (VL level), information of the input voltage Vin is transmitted. When the control signal CS is at high level (VH level), the output has high impedance. Even when the control signal CS changes to low level (VL level) from this state to output information of the input voltage Vin, no forward bias is generated because the substrate potential of the N-channel transistors N11, N12, N21, and N22 is at VL level.

Figure 4:
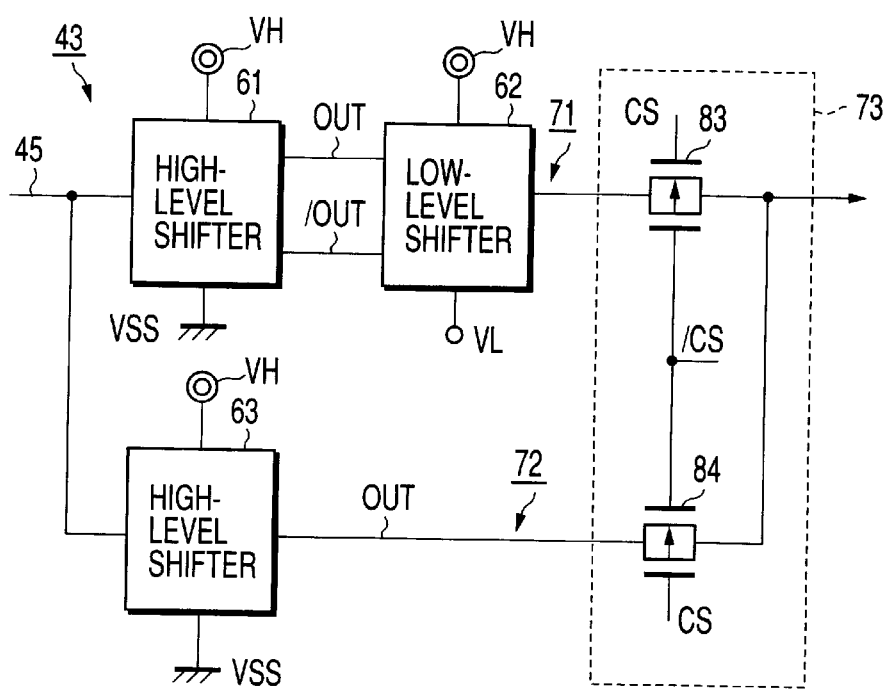
FIG. 4 is a circuit diagram showing another example of the switching circuit shown in FIG. 1.

FIG. 4 shows another example of the switching circuit 73. This switching circuit 73 comprises transfer gates 83 and 84 connected to the first and second paths 71 and 72, respectively. These transfer gates 83 and 84 are selectively controlled by the control signals CS and /CS. That is, when the control signal CS is at high level (VH level), the transfer gate 83 is activated, and the output voltage from the low-level shifter 62 is selected. When the control signal CS is at low level (VL level), the transfer gate 84 is activated, and the output voltage from the high-level shifter 63 is selected.

According to the first embodiment, the first path 71 has the high-level shifter 61 and the low-level shifter 62 and the second path 72 has only the high-level shifter 63. The switching circuit 73 can select one of the output voltages from the first and second paths 71 and 72 in accordance with the control signal CS corresponding to the operation mode. When a high-speed operation is required as in data read, therefore, a necessary voltage can be output at high speed by selecting the second path 72 by the switching circuit 73.

Second Embodiment

FIG. 5 shows the second embodiment of the present invention. The same reference numerals as in the first embodiment denote the same parts, and only the difference will be explained.

In the first embodiment, a signal of the address-select line 45 is supplied to the first and second paths 71 and 72, so both the first and second paths 71 and 72 operate. That is, because a level shifter on a path not selected by the switching circuit 73 operates, electric current is wasted. In the second embodiment, therefore, a level shifter on an unselected path is inactivated.

That is, a switching circuit 74 is placed at the input terminals of first and second paths 71 and 72. An address-select line 45 is connected to the input terminal of the switching circuit 74. The output terminals of this switching circuit 74 are connected to the first and second paths 71 and 72. This switching circuit 74 is controlled by a control signal CS. Accordingly, when the first path 71 is selected by a switching circuit 73 and the switching circuit 74, the second path 72 is unselected. When the second path 72 is selected, the first path 71 is unselected.

FIG. 6 shows an example of the switching circuit 74. This switching circuit 74 is composed of transfer gates 85 and 86. The input terminals of these transfer gates 85 and 86 are connected to the address-select line 45. The output terminal of the transfer gate 85 is connected to the first path 71. The output terminal of the transfer gate 86 is connected to the second path 72. These transfer gates 85 and 86 are controlled by the control signal CS and a control signal /CS. An N-channel transistor 87 is connected to the output terminal of the transfer gate 85 and the ground. The gate of this transistor 87 is connected to the gate of an N-channel transistor of the transfer gate 85. Also, an N-channel transistor 88 is connected between the output terminal of the transfer gate 86 and the ground. The gate of this transistor 88 is connected to the gate of an N-channel transistor of the transfer gate 86.

In the above configuration, when the control signal CS is at high level (Vcc level), the transfer gate 85 is activated, and a signal of the address-select line 45 is transferred to the first path 71. In this state, the transfer gate 86 is inactivated, the transistor 88 is turned on, and the second path 72 is grounded.

On the other hand, when the control signal CS is at low level (VSS level), the transfer gate 86 is activated, and a signal of the address-select line 45 is transferred to the second path 72. In this state, the transfer gate 85 is inactivated, the transistor 87 is turned on, and the first path 71 is grounded.

FIG. 7 shows another example of the switching circuit 74. This switching circuit 74 is composed of AND circuits 89 and 90. One input terminal of each of these AND circuits 89 and 90 is connected to the address-select line 45. The control signal CS is supplied to the other input terminal of the AND circuit 89. The control signal /CS is supplied to the other input terminal of the AND circuit 90. The output terminals of the AND circuits 89 and 90 are connected to the first and second paths 71 and 72, respectively.

In the above configuration, when the control signal CS is at high level (Vcc level), the input logic of the AND circuit 89 holds, so a signal of the address-select line 45 is transferred to the first path 71. When the control signal /CS is at high level, the input logic of the AND circuit 90 holds, so a signal of the address-select line 45 is transferred to the second path 72.

In the above second embodiment, the switching circuit 74 controlled by the control signal CS is arranged at the input terminals of the first and second paths 71 and 72. This switching circuit 74 supplies a signal of the address-select line 45 to one of the first and second paths 71 and 72. Therefore, only a level shifter forming one of the first and second paths selected by the switching circuits 73 and 74 operates, and a level shifter forming the unselected path does not operate. This can reduce the current consumption.

Third Embodiment

Figure 8:
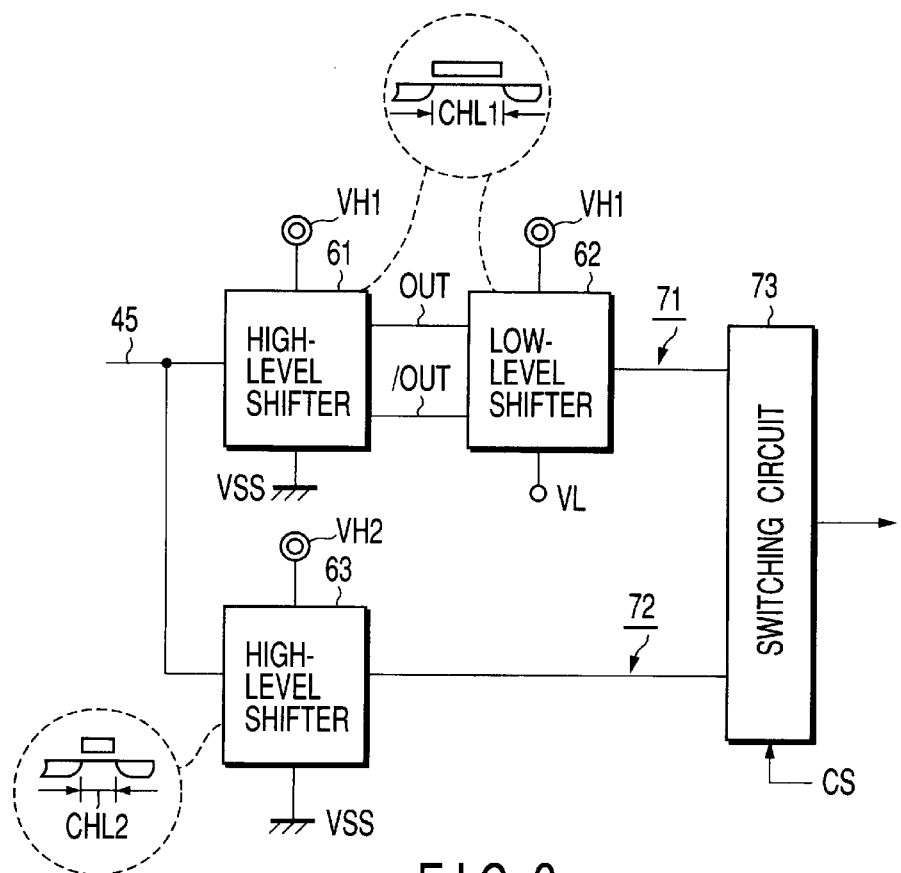
FIG. 8 is a block diagram showing the third embodiment of the present invention.

FIG. 8 shows the third embodiment of the present invention. The third embodiment differs from the first embodiment in the following respect. That is, in the third embodiment, a power supply of high- and low-level shifters 61 and 62 of a first path 71 is different from that of a high-level shifter 63 of a second path 72. More specifically, VH1 is supplied as a high potential to the high- and low-level shifters 61 and 62, and VH2 is supplied as a high potential to the high-level shifter 63. For example, the relationship between these high potentials VH1 and VH2 is set as follows:

VH1>VH2>VSS

In the third embodiment, in a write operation requiring a high word line voltage, a word line voltage is generated via the first path 71. Therefore, the only high potential VH2 supplied to the high-level shifter 63 of the second path 72 is 5V (VREAD) for use in a read operation.

If a write operation is performed using the second path 72, both 5 and 10V are necessary as the high potential VH2. In this case, a transistor of the high-level shifter 63 must have a withstand voltage of 10V, so the channel length of this transistor must be sufficiently long. When the channel length of a transistor thus increases, the performance of the transistor naturally lowers, making a high-speed operation difficult.

In the third embodiment, however, the first path 71 is used in a write operation requiring a high voltage, and the second path 72 is used only in a read operation. Hence, the only high potential supplied to the high-level shifter 63 is 5V, so the withstand voltage of the transistor of the high-level shifter 63 can be decreased. Accordingly, the channel length of the transistor of this high-level shifter 63 can be shortened. This can further increase the operating speed of the high-level shifter 63.

As shown in FIG. 8, the channel length (CHL1) of transistors of the high- and low-level shifters 61 and 62 of the first path 71 is longer than the channel length (CHL2) of the transistor of the high-level shifter 63. Therefore, the operating speed of the first path 71 is lower than that of the second path 72. However, the first path 71 is used in a write operation, and this write operation need not be so fast as a read operation. So, the operating speed is of no problem.

Note that in the third embodiment, a control signal CS can be a logic signal of VH1 (=VH) level as in the first embodiment. Note also that the switching circuits 73 and 74 explained in the first and second embodiments can be applied to the third embodiment.

Fourth Embodiment

In the first to third embodiments described above, the present invention is applied to level shifters for generating a word line potential. However, the present invention is also applicable to column-select level shifters for generating a bit line potential.

Column-select circuits will be briefly described below.

Figure 9:
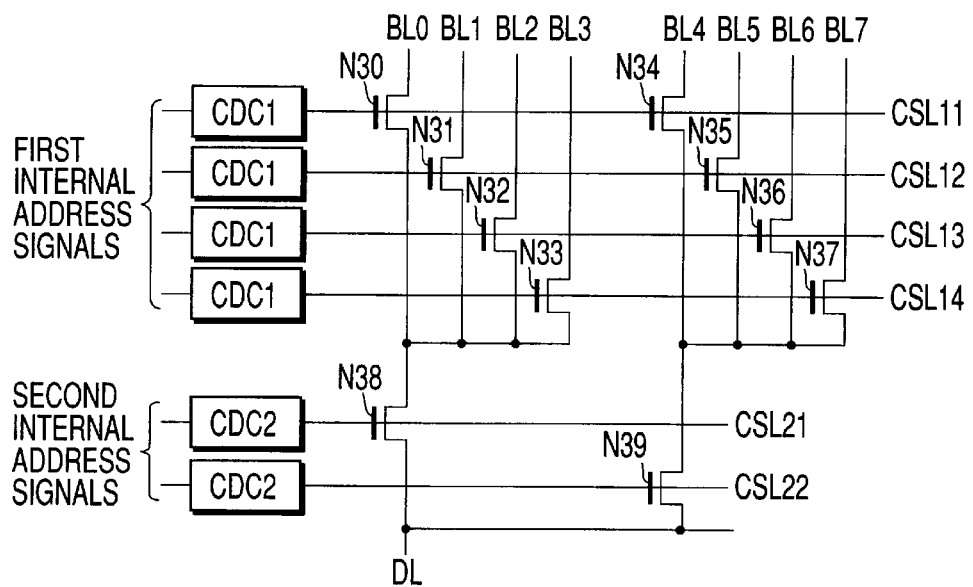
FIG. 9 is a circuit diagram showing column-select circuits.
Figure 16:
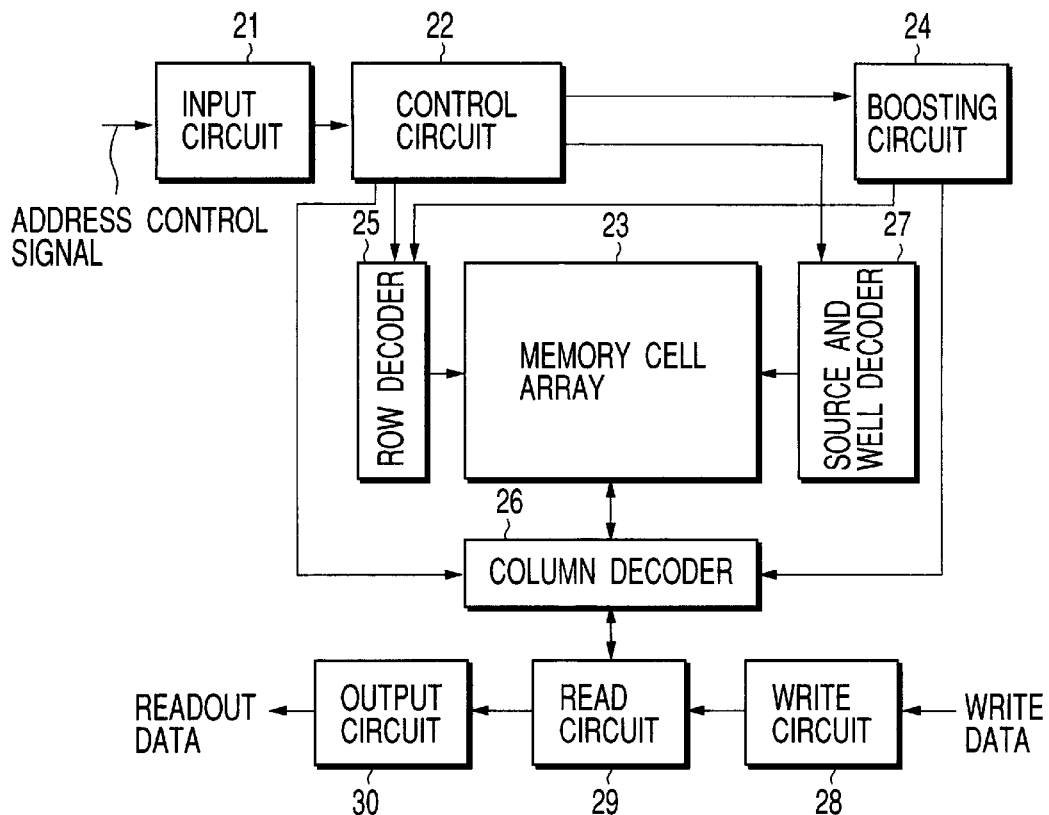
FIG. 16 is a block diagram showing a nonvolatile semiconductor memory.
Figure 17:
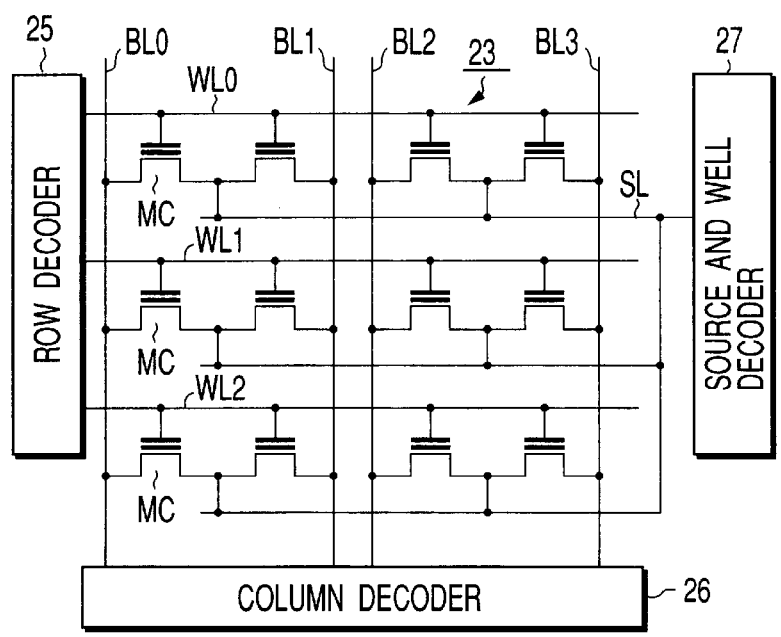
FIG. 17 is a circuit diagram showing a portion of FIG. 16 in detail.
Figure 18:
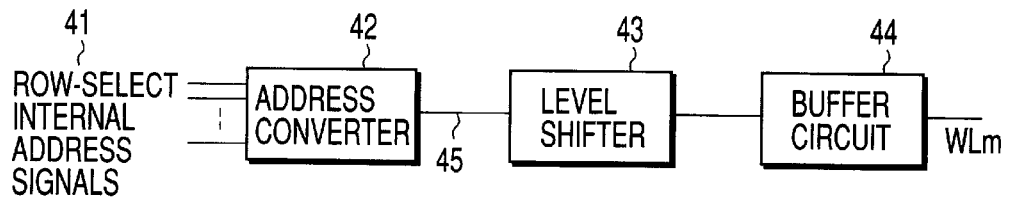
FIG. 18 is a block diagram showing an example of a row decoder shown in FIGS. 16 and 17.

FIG. 9 is a column-select circuit example. This column-select system has a plurality of first column decoders CDC1 and a plurality of second column decoders CDC2. These first and second column decoders CDC1 and CDC2 are supplied with first and second internal address signals for column selection generated via an input circuit 21 and a control circuit 22 shown in FIG. 16. The first column decoders CDC1 decode the first internal address signal to select one of a plurality of first column-select lines CSL11 to CSL14. The second column decoders CDC2 decode the second internal address signal to select one of a plurality of second column-select signals CSL21 and CSL22. First column gates N30 to N33 and N34 to N37 composed of N-channel transistors select bit lines BL0 to BL3 and bit lines BL4 to BL7 by the selected one of the first column-select lines CSL11 to CSL14. Second column gates N38 and N39 composed of N-channel transistors connect a data line DL to the selected bit line by the selected one of the second column-select lines CSL21 and CSL22.

FIG. 10 shows a circuit example of the column decoders CDC1 and CDC2 shown in FIG. 9. The arrangement of this column decoder is substantially the same as a row decoder, i.e., the column decoder includes an address converter 92 for receiving column-select internal address signals 91, a level shifter 93, and a buffer circuit 94. The configuration of the level shifter 93 is different from the row decoder. That is, a column-select line CSLm uses a boosted potential other than a power supply voltage Vcc in data read and write, and does not require any voltage in data erase. The level shifter 93 converts the level of a signal supplied from the address converter 92 via the address-select line 95. The buffer circuit 94 shapes the waveform of this signal and supplies the signal to the first or second column-select line.

Figure 19:
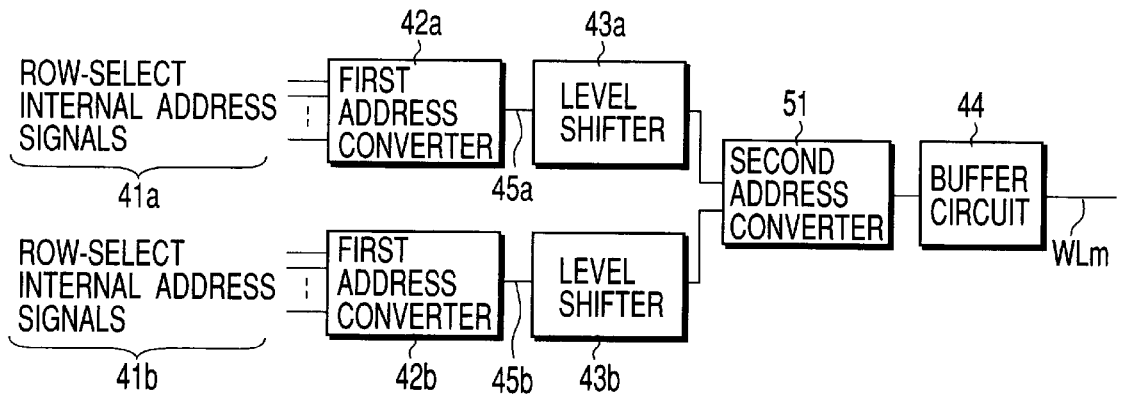
FIG. 19 is a block diagram showing another example of the row decoder.
Figure 20A:
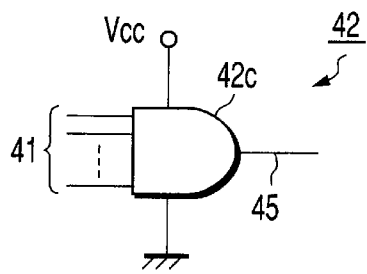
FIGS. 20A and 20B are circuit diagrams showing examples of address converters.
Figure 20B:
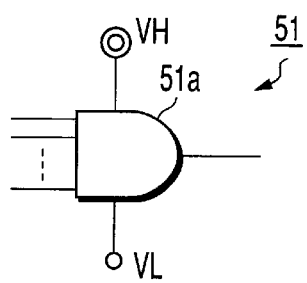
Figure 20C:
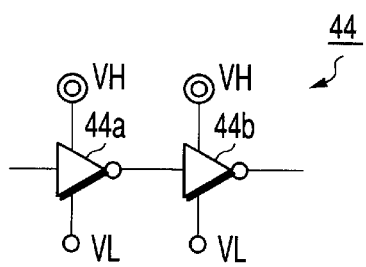
FIG. 20C is a circuit diagram showing an example of a buffer circuit.

FIG. 11 shows another example of the column decoder. This circuit corresponds to the row decoder example shown in FIG. 19. First address converters 92a and 92b and level shifters 93a and 93b of two systems generate predetermined levels from divided column-select internal address signals 91a and 91b, respectively. The output voltages from these level shifters 93a and 93b are supplied to a second address converter 96. This second address converter 96 generates a required voltage and supplies this voltage to the column-select line CSLm via the buffer circuit 94.

The potential to be supplied to the column-select line CSLm in data read can be changed from that in data write, as in the case of the row decoder. That is, in data read, the voltage (the voltage of the column-select line) of a column gate is set at, e.g., 5V in order to lower the resistance of a bit line. Also, an unselected column gate is set at 0V.

In a write operation, on the other hand, the voltage of a column gate is set at, e.g., 10V in order to lower the write resistance of a bit line. Also, an unselected column gate is set at 0V.

In an erase operation, all column gates are set at, e.g., 0V since the column-select system has no relationship to the operation.

FIG. 12 shows a conventional level shifter 93 (including 93a and 93b). This level shifter 93 is substantially the same as the row-select level shifter. However, since a column-select system does not require any negative potential, this level shifter 93 comprises only a high-level shifter 100 and has no low-level shifter. This high-level shifter 100 outputs a high-level (Vcc-level) signal, supplied via an address-select line 95, as a signal of VHC level higher than the Vcc level. Also, when a low-level (VSS-level) signal is supplied via the address-select line 95, the high-level shifter 100 outputs a VSS-level signal. The circuit configuration of this high-level shifter 100 is analogous to, e.g., FIG. 22A.

The high potentials VHC in individual operation modes are as follows:

Read VHC=5V
Write VHC=10V

The above-mentioned column-select level shifter has the following problem. Voltages are supplied to a column-select line via the high-level shifter 100 in all modes. To be able to withstand the high potential VHC=10V, this high-level shifter 100 is composed of a transistor having a long channel length. Hence, especially in a read operation required to be fast, the level conversion rate is very lowered.

In the fourth embodiment, therefore, two high-level shifters having different high power supply potentials VHC are selectively activated in accordance with the operation mode.

FIG. 13 shows a level shifter 93 according to the fourth embodiment of the present invention. This level shifter 93 has first and second paths 111 and 112 connected to an address-select line 95. A high-level shifter 113 is connected to the first path 111, and a high-level shifter 114 is connected to the second path 112. The power supplies of the high-level shifter 113 are a high potential VHC1 and the ground potential. The power supplies of the high-level shifter 114 are a high potential VHC2 and the ground potential. The first and second paths 111 and 112 are connected to a switching circuit 115. A control signal CS is supplied to this switching circuit 115. In accordance with data write or read, the switching circuit 115 selects one of the first and second paths 111 and 112 by the control signal CS. The level of this control signal CS is at, e.g., the high potential VHC1.

FIG. 14 shows the relationship between the high potentials VHC1 and VHC2. The high potential VHC1 is set at 5V in data read and at 10V in data write. The high potential VHC2 is set at 5V in both data read and write. Hence, a transistor of the high-level shifter 114 to which the high potential VHC2 is supplied can have a withstand voltage lower than that of a transistor of the high-level shifter 113 to which the high potential VHC1 is supplied. Accordingly, as in the embodiment shown in FIG. 8, the channel length of the transistor of the high-level shifter 114 can be shorter than that of the transistor of the high-level shifter 113.

Figure 22A:
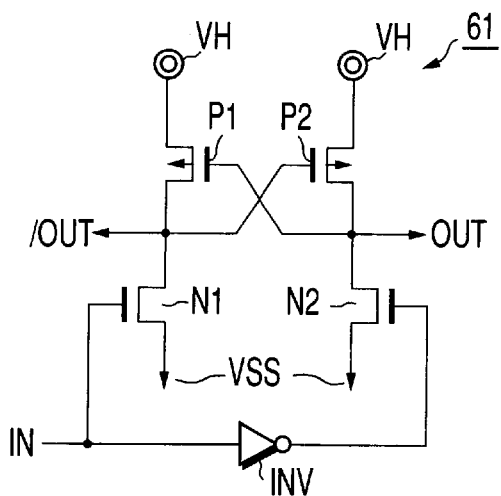
FIG. 22A is a circuit diagram showing an example of a high-level shifter.
Figure 22B:
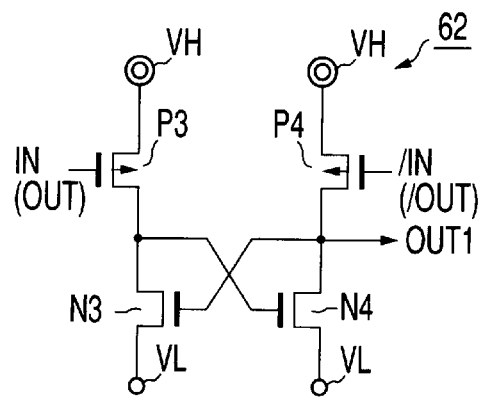
FIG. 22B is a circuit diagram showing an example of a low-level shifter.

The circuit configuration of the high-level shifters 113 and 114 is basically the same as, e.g., FIG. 22A except for the high potentials VHC1 and VHC2 and the channel lengths as described above.

When data write is performed in the above arrangement, the switching circuit 115 selects the first path 111 in accordance with the control signal CS, and outputs a high voltage generated by the high-level shifter 113. In data read, the switching circuit 115 selects the second path 112 in accordance with the control signal CS, and outputs a voltage generated by the high-level shifter 114.

In the fourth embodiment described above, the first and second paths 111 and 112 are connected to the address-select line 95 which is connected to the output terminal of the column-select address converter. The high-level shifter 113 to which the high potential VHC1 for data write is supplied is connected to the first path 111. The high-level shifter 114 to which the high potential VHC2 for data read is supplied is connected to the second path 112. The switching circuit 115 controlled by the control signal CS selects the first or second path 111 or 112. In addition, the high-level shifter 114 is composed of a transistor having a channel length shorter than that of a transistor of the high-level shifter 113. In data read, therefore, the switching circuit 115 selects the second path 112, so a necessary voltage can be output at high speed.

The circuits shown in FIGS. 2 to 3B can be applied to the switching circuit 115. Also, the switching circuit 74 shown in FIGS. 5 to 7 is applicable to the fourth embodiment.

In the first to fourth embodiments described above, the first and second paths are formed, and these first and second paths are selected by the switching circuit. However, if the third level or higher is necessary, it is possible to form three or more paths and select these paths by the switching circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first level shifter having an input terminal for receiving an input signal and an output terminal, said first level shifter outputting one of a first potential and a second potential lower than the first potential from said output terminal in accordance with the level of the input signal;
   a second level shifter having an input terminal connected to said output terminal of said first level shifter, said second level shifter outputting one of the first potential and a third potential lower than the second potential from an output terminal in accordance with the output potential from said first level shifter;
   a third level shifter having an input terminal for receiving said input signal and an output terminal, said third level shifter outputting one of said first and second potentials from said output terminal in accordance with the level of said input signal; and
   a first switching circuit connected to said output terminals of said second and third level shifters, said first switching circuit selecting one of the output potentials from said second and third level shifters in accordance with a control signal.

2. The device according to claim 1, wherein said first switching circuit selects the output potential from said second level shifter when said control signal indicates an erase mode, and selects the output potential from said third level shifter when said control signal indicates a read mode.

3. The device according to claim 1, wherein the first potential in a write mode differs from the first potential in a read mode.

4. The device according to claim 1, wherein said first switching circuit comprises a plurality of clocked inverter circuits controlled by said control signal.

5. The device according to claim 1, wherein said first switching circuit comprises a plurality of transfer gates controlled by said control signal.

6. The device according to claim 1, further comprising a second switching circuit having an input terminal to which said input signal is supplied and output terminals connected to said input terminals of said first and third level shifters, said second switching circuit supplying the input signal to one of said first and third level shifters in accordance with the control signal.

7. The device according to claim 6, wherein said second switching circuit comprises:
   a first transfer gate having an input terminal to which said input signal is supplied and an output terminal connected to said input terminal of said first level shifter, said first transfer gate being controlled by the control signal;
   a first transistor connected between said output terminal of said first transfer gate and the ground, the gate of said first transistor being supplied with the control signal, and said first transistor being turned on in accordance with the control signal when said first transfer gate is kept off;
   a second transfer gate having an input terminal to which the input signal is supplied and an output terminal connected to said input terminal of said third level shifter, said second transfer gate being controlled by the control signal so as to be complementary to said first transfer gate; and
   a second transistor connected between said output terminal of said second transfer gate and the ground, the gate of said second transistor being supplied with the control signal, and said second transistor being turned on in accordance with the control signal when said second transfer gate is kept off.

8. The device according to claim 6, wherein said second switching circuit comprises:
   a first logic circuit having a first input terminal to which said input signal is supplied, a second input terminal to which said control signal is supplied, and an output terminal connected to said input terminal of said first level shifter; and
   a second logic circuit having a third input terminal to which said input signal is supplied, a fourth input terminal to which an inverted signal of the control signal is supplied, and an output terminal connected to said input terminal of said third level shifter.

9. A semiconductor device comprising:
   a first level shifter having an input terminal for receiving an input signal and an output terminal, said first level shifter outputting one of a first potential and a second potential lower than the first potential from said output terminal in accordance with the level of the input signal;
   a second level shifter having an input terminal connected to said output terminal of said first level shifter, said second level shifter outputting one of the first potential and a third potential lower than the second potential from an output terminal in accordance with the output potential from said first level shifter;
   a third level shifter having an input terminal for receiving the input signal and an output terminal, said third level shifter outputting one of the second potential and a fourth potential lower than the first potential and higher than the second potential from said output terminal in accordance with the level of the input signal; and
   a first switching circuit connected to said output terminals of said second and third level shifters, said first switching circuit selecting one of the output potentials from said second and third level shifters in accordance with a control signal.

10. The device according to claim 9, wherein said first switching circuit selects the output potential from said second level shifter when the control signal indicates an erase mode, and selects the output potential from said third level shifter when the control signal indicates a read mode.

11. The device according to claim 9, wherein said third level shifter comprises a first transistor, said first and second level shifters comprise a second transistor, and the channel length of said first transistor is shorter than that of said second transistor.

12. The device according to claim 9, further comprising a second switching circuit having an input terminal to which said input signal is supplied and output terminals connected to said input terminals of said first and third level shifters, said second switching circuit supplying the input signal to one of said first and third level shifters in accordance with the control signal.

13. The device according to claim 12, wherein said second switching circuit comprises:
   a first transfer gate having an input terminal to which said input signal is supplied and an output terminal connected to said input terminal of said first level shifter, said first transfer gate being controlled by the control signal;
   a first transistor connected between said output terminal of said first transfer gate and the ground, the gate of said first transistor being supplied with the control signal, and said first transistor being turned on in accordance with the control signal when said first transfer gate is kept off;
   a second transfer gate having an input terminal to which said input signal is supplied and an output terminal connected to said input terminal of said third level shifter, said second transfer gate being controlled by the control signal so as to be complementary to said first transfer gate; and
   a second transistor connected between said output terminal of said second transfer gate and the ground, the gate of said second transistor being supplied with the control signal, and said second transistor being turned on in accordance with the control signal when said second transfer gate is kept off.

14. The device according to claim 12, wherein said second switching circuit comprises:
   a first logic circuit having a first input terminal to which said input signal is supplied, a second input terminal to which said control signal is supplied, and an output terminal connected to said input terminal of said first level shifter; and
   a second logic circuit having a third input terminal to which said input signal is supplied, a fourth input terminal to which an inverted signal of the control signal is supplied, and an output terminal connected to said input terminal of said third level shifter.

15. A semiconductor device comprising:
   a first level shifter having an input terminal for receiving an input signal and an output terminal, said first level shifter outputting one of a first potential and a second potential lower than the first potential from said output terminal in accordance with the level of the input signal;
   a second level shifter having an input terminal for receiving the input signal and an output terminal, said second level shifter outputting one of the second potential and a third potential lower than the first potential and higher than the second potential in accordance with the level of the input signal; and
   a first switching circuit connected to said output terminals of said first and second level shifters, said first switching circuit selecting one of the output potentials from said first and second level shifters in accordance with a control signal.

16. The device according to claim 15, wherein said first switching circuit selects the output potential from said first level shifter when the control signal indicates a write mode, and selects the output potential from said second level shifter when the control signal indicates a read mode.

17. The device according to claim 15, wherein said first level shifter comprises a first transistor, said second level shifter comprises a second transistor, and the channel length of said second transistor is shorter than that of said first transistor.

18. The device according to claim 15, further comprising a second switching circuit having an input terminal to which said input signal is supplied and output terminals connected to said input terminals of said first and second level shifters, said second switching circuit supplying the input signal to one of said first and second level shifters in accordance with the control signal.

19. The device according to claim 18, wherein said second switching circuit comprises:
   a first transfer gate having an input terminal to which said input signal is supplied and an output terminal connected to said input terminal of said first level shifter, said first transfer gate being controlled by the control signal;
   a first transistor connected between said output terminal of said first transfer gate and the ground, the gate of said first transistor being supplied with the control signal, and said first transistor being turned on in accordance with the control signal when said first transfer gate is kept off;
   a second transfer gate having an input terminal to which said input signal is supplied and an output terminal connected to said input terminal of said second level shifter, said second transfer gate being controlled by the control signal so as to be complementary to said first transfer gate; and
   a second transistor connected between said output terminal of said second transfer gate and the ground, the gate of said second transistor being supplied with the control signal, and said second transistor being turned on in accordance with the control signal when said second transfer gate is kept off.

20. The device according to claim 18, wherein said second switching circuit comprises:
   a first logic circuit having a first input terminal to which said input signal is supplied, a second input terminal to which the control signal is supplied, and an output terminal connected to said input terminal of said first level shifter; and
   a second logic circuit having a third input terminal to which said input signal is supplied, a fourth input terminal to which the control signal is supplied, and an output terminal connected to said input terminal of said second level shifter.

21. The device according to claim 15, wherein said first switching circuit comprises a plurality of clocked inverter circuits controlled by the control signal.

22. The device according to claim 15, wherein said first switching circuit comprises a plurality of transfer gates controlled by the control signal.

* * * * *

UNITED STATES PATENT AND TRADEMARK OFFICE
CERTIFICATE OF CORRECTION

PATENT NO.    : 6,477,092 B2  
DATED         : November 5, 2002  
INVENTOR(S)   : Yoshinori Takano It is certified that error appears in the above-identified patent and that said Letters Patent is hereby corrected as shown below:

<u>Title page,</u>
Item [56], References Cited, add:
-- FOREIGN PATENT DOCUMENTS
JP  10-283789  10/1998
JP  11-185489  7/1999 --

Signed and Sealed this

First Day of July, 2003

JAMES E. ROGAN
*Director of the United States Patent and Trademark Office*